(12) United States Patent
Birnstock et al.

(10) Patent No.: US 8,227,029 B2
(45) Date of Patent: Jul. 24, 2012

(54) METHOD FOR DEPOSITING A VAPOUR DEPOSITION MATERIAL

(75) Inventors: Jan Birnstock, Dresden (DE); Ansgar Werner, Dresden (DE); Micheal Hofmann, Dresden (DE)

(73) Assignee: Novaled AG, Dresden (DE)

( * ) Notice: Subject to any disclaimer, the term of this patent is extended or adjusted under 35 U.S.C. 154(b) by 535 days.

(21) Appl. No.: 12/134,469

(22) Filed: Jun. 6, 2008

(65) Prior Publication Data

US 2009/0011582 A1 Jan. 8, 2009

Related U.S. Application Data

(63) Continuation of application No. PCT/EP2006/011775, filed on Dec. 7, 2006.

(30) Foreign Application Priority Data

Dec. 7, 2005 (EP) .................................. 05026703

(51) Int. Cl.
*C23C 16/00* (2006.01)

(52) U.S. Cl. ..................................... 427/248.1; 118/726

(58) Field of Classification Search ............... 427/248.1; 118/726, 723 VE
See application file for complete search history.

(56) References Cited

U.S. PATENT DOCUMENTS

| 3,644,770 A | 2/1972 | Bell |
| 3,673,011 A | 6/1972 | Strull |
| 3,913,999 A | 10/1975 | Clarke |
| 5,093,698 A | 3/1992 | Egusa |
| 5,315,129 A | 5/1994 | Forrest et al. |
| 5,922,396 A | 7/1999 | Thompson et al. |
| 6,287,712 B1 | 9/2001 | Bulovic et al. |
| 6,312,836 B1 | 11/2001 | Bulovic et al. |
| 6,387,546 B1 | 5/2002 | Hamada et al. |
| 6,605,317 B1 | 8/2003 | Kathirgamanathan et al. |
| 6,620,528 B1 | 9/2003 | Yamazaki |
| 6,809,333 B2 | 10/2004 | Ishikawa et al. |
| 6,818,329 B1 | 11/2004 | Liao et al. |
| 2001/0055841 A1 | 12/2001 | Yamazaki et al. |
| 2003/0180457 A1 | 9/2003 | Murakami et al. |

(Continued)

FOREIGN PATENT DOCUMENTS

DE 10261609 7/2004

(Continued)

OTHER PUBLICATIONS

Baldo, M. A. et al., "Low pressure vapor phase deposition of small molecular weight organic light emitting device structures," Appl. Phys. Lett., 71 (21), Nov. 24, 1997, p. 3033.

(Continued)

*Primary Examiner* — Kelly M Gambetta
(74) *Attorney, Agent, or Firm* — Sutherland Asbill & Brennan, LLP

(57) ABSTRACT

Method for depositing a vapour deposition material on a base material, in particular for doping a semiconductor material, in which a vapour deposition batch, in which the vapour deposition material is enclosed in an air-tight manner by a shell, is introduced into a vapour deposition chamber and the shell is opened in the vapour deposition chamber, so that the vapour deposition material in the vapour deposition chamber then evaporates and is deposited on the base material, wherein the shell is opened by at least partially melting by heating a meltable shell material which at least partially forms the shell at a melting temperature which is lower than an evaporation temperature of the vapour deposition material.

10 Claims, 5 Drawing Sheets

U.S. PATENT DOCUMENTS

| | | | |
|---|---|---|---|
| 2003/0197465 | A1 | 10/2003 | Qiu et al. |
| 2004/0016907 | A1 | 1/2004 | Shi |
| 2004/0037987 | A1 | 2/2004 | Carlton et al. |
| 2004/0173929 | A1 | 9/2004 | Ghosh et al. |
| 2005/0016461 | A1 | 1/2005 | Klug et al. |
| 2005/0040390 | A1 | 2/2005 | Pfeiffer et al. |
| 2005/0042548 | A1 | 2/2005 | Klauk et al. |
| 2005/0061232 | A1 | 3/2005 | Werner et al. |
| 2005/0072971 | A1 | 4/2005 | Marrocco et al. |
| 2005/0136232 | A1 | 6/2005 | Forrest et al. |
| 2005/0145179 | A1 | 7/2005 | Catteneo |
| 2005/0179370 | A1 | 8/2005 | Nakayama et al. |
| 2006/0079004 | A1 | 4/2006 | Werner et al. |
| 2007/0249148 | A1 | 10/2007 | Werner et al. |
| 2007/0278479 | A1 | 12/2007 | Werner et al. |
| 2009/0179189 | A1 | 7/2009 | Werner et al. |

FOREIGN PATENT DOCUMENTS

| | | | |
|---|---|---|---|
| EP | 1798306 B1 | * | 6/2008 |
| JP | 5931865 | | 2/1984 |
| JP | 59031865 A | * | 2/1984 |
| WO | 02/093664 | | 11/2002 |
| WO | WO03/088271 | | 10/2003 |
| WO | 2004/070787 | | 8/2004 |

OTHER PUBLICATIONS

Baldo, M., et al., "Organic vapor phase deposition," Advanced Materials, 1998, 10, No. 18, pp. 1505-1514.

Bard, A. J., Faulkner, R.J., Electrochemical Methods: Fundamentals and Applications, Wiley, 2nd Ed., 2000.

Bloom, C. J. et al., "Low work function reduced metal complexes as cathodes in organic electroluminescent devices," J. of Phyiscal Chemistry B, vol. 107, No. 13, pp. 2933-2938.

Burrows, P.E. et al., "Organic vapor phase deposition: a new method for the growth of organic thin films with large optical non-linearities," Journal of Crystal Growth, 156, 1995, pp. 91-98.

Elwell, D., "Electrocrystallization of semiconducting materials from molten salt and orgnaic solutions," Journal of Crystal Growth, vol. 52, 1981, pp. 741-752.

Gao Y. et al., "Cs doping and energy level shift in CuPC", Chemical Physics Letters, North-Holland, Amsterdam, NL, vol. 380, Oct. 21, 2003, p. 451-455.

Gebeyehu, et al., "Bulk-heterojunction photovoltaic devices based on donor-acceptor organic small molecules blends," Solar Energy Materials and Solar Cells, 2003, vol. 79, pp. 81-92 (p. 1-11 on enclosed copy).

Harada, Kentaro et al., "Realization of organic pn-homojunction using a novel n-type doping technique, Proceedings of SPIE—The international Society for Optical Engineering; Organic Optoelectronics and Photonics 2004," vol. 5464, Sep. 2004, pp. 1-9.

Jianmin Shi, et al., "Doped Organic Electroluminescent Devices with Improved Stability," Appl. Phys. Lett. 70(13), Mar. 31, 1997, pp. 1665-1667.

Muramatsu, T. et al., "Preparation and Properties of a novel heterocyclic dispiro compound, 3, 10-diaza-N,N-dimethyldispiro[5.0.5.3]pentadeca-1,4,8,11-tetraene." Chemistry Letters, pp. 151-152, (1996).

Pfeiffer, M, et al., "Doped Organic semiconductors: physics and application in light emitting diodes," Organic Electronics, Elsevier, Amsterdam, NL, vol. 4, No. 2/3, Sep. 2003, pp. 89-103, XP001177135, ISSN: 1556-1199.

Shtein, Max et al., "Effects of film morphology and gate dielectric surface preparation on the electrical characteristics of organic-vapor-phase-deposited pentacene thin-film transistors," Applied Physics Letters, vol. 81, No. 2, p. 268, Jul. 8, 2002.

Shtein, Max et al., "Material transport regimes and mechanisms for growth of molecular organic thin films using low-pressure organic vaport phase deposition," Journal of Applied Physics, vol. 89, No. 2, p. 1470, Jan. 15, 2001.

Tang, C. W., et al., "Electroluminescence of doped organic thin films," Journal of Applied Physics, (1989), vol. 65:9, pp. 3610-3616.

Tang, C.W. et al., "Organic electroluminescent diodes," Applied Physics Letters, vol. 51, No. 12, Sep. 21, 1987, pp. 913-915.

Tsiper, E.V. and Soos, Z.G.; "Charge redistribution and polarization energy of organic molecular crystals," Physical Review B; vol. 64; 195124-1.

Vaid T.P. et al, "investigations of 9,10-diphenylacridyl radical as an isostructural dopant for the molecular semiconductor 9, 10-diphenylanthracene," Chemistry of Materials, American Chemical Society, Bd. 15, Nr. 22, 4292-4299 (2003).

Wintgens, V. et al., "Reduction of Pyrylium Salts: Study by ESR and UV_Visible Spectroscopy of the Reversible Dimerization of the Pyranyl Radical," New. J. Chem., 10/6, 345-350 (1986).

Zhou C. et al., "Modulated chemical doping of individual carbon nanotubes," Science, American Association for the Advancement of Science, vol. 290, No. 5496, pp. 1552-1555.

Zhou, Theodore X, et al., "Stable and efficient electrophosphorescent organic light-emitting devices grown by organic vapor phase deposition," Applied Physics Letters, 86, 021107 (2005).

Response to Office Action; U.S. Appl. No. 11/576,553; (Sep. 25, 2009).

Non-Final Office Action; U.S. Appl. No. 11/576,553; (Jun. 25, 2009).

Non-final Rejection; U.S. Appl. No. 11/241,477; Jun. 18, 2007.

Response to Office Action; U.S. Appl. No. 11/241,477; Sep. 18, 2007.

Non-final Rejection; U.S. Appl. No. 11/241,477; Dec. 14, 2007.

Notice of Allowance; U.S Appl. No. 11/241,477; Jun. 13, 2008.

Notice of Allowance; U.S. Appl. No. 11/241,477; Oct. 20, 2008.

Disclosure Under 37 CFR 1.56.

Non-final Office Action, U.S. Appl. No. 10/595,319; Jan. 11, 2010.

Hamm, S. "Rectifying organic juntions of molecular assemblies based on perylene ion salts," J. Chem. Phys., vol. 103, No. 24, Dec. 22, 1995, pp. 10689-10695.

Blochwitz, J. et al., "Interface electronic structure of organic semiconductors with controlled doping levels," Org. Electronics 2, 97 (2001).

Akers, K.L. et al., "The Spatially Resolved Composition of K-Doped C60 Films," Thin Solid Films, vol. 257 (1995): pp. 204-210.

Yamashita, K. et al., "Fabrication of an Organic p-n Homojunction Diode Using Electrochemically Cation- and Photochemically Anion-Doped Polymer," Jpn. J. Appl. Phys. vol. 34 (Jul. 1995); pp. 3794-3797.

Werner, A.G. et al., "n-Type Doping of Organic Thin Films Using Cationic Dyes," Adv. Funct. Mater., vol. 14, No. 3 (Mar. 2004): pp. 255-260.

Werner, A. G. et al., "Pyronin B as a donor for n-type doping of organic thin films," Applied Physics Letters, vol. 82, No. 25, Jun. 23, 2003, pp. 4495-4497.

Nollau, A. et al., "Controlled n-type doping of a molecular organic semiconductor: naphthalenetetracarboxylic dianhydride (NTCDA) doped with bis(ethylenedithio)-tetrathiafulvalene (BEDT-TTF)," J. Appl. Phys., vol. 87, No. 9, May 1, 2006, pp. 4340-4343.

* cited by examiner

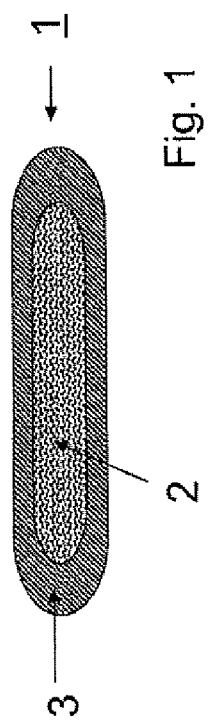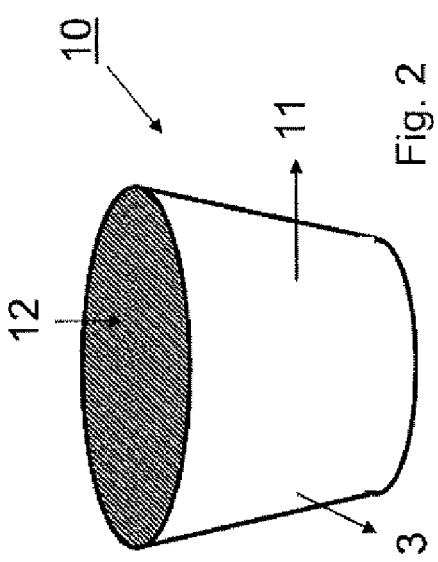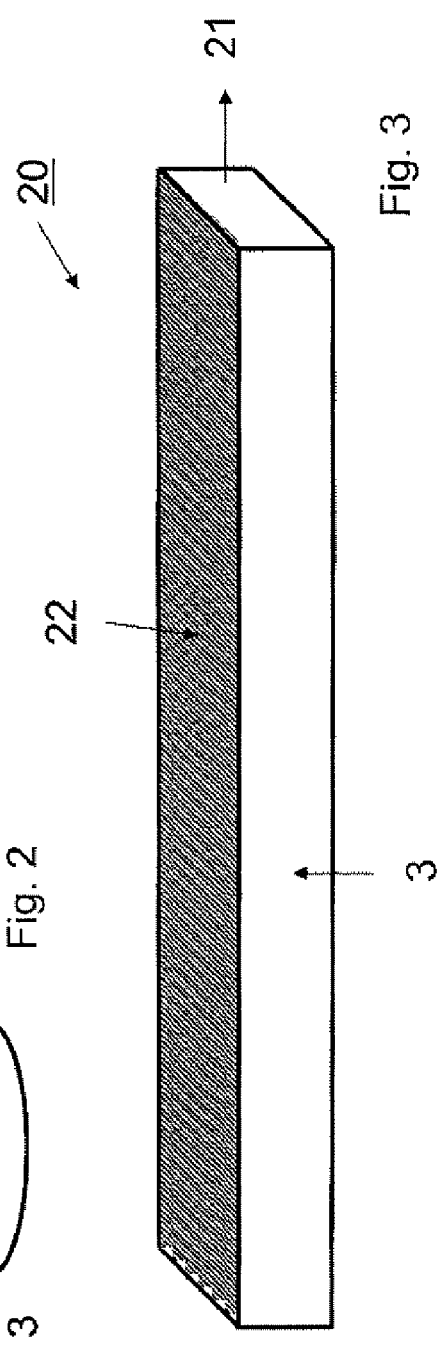

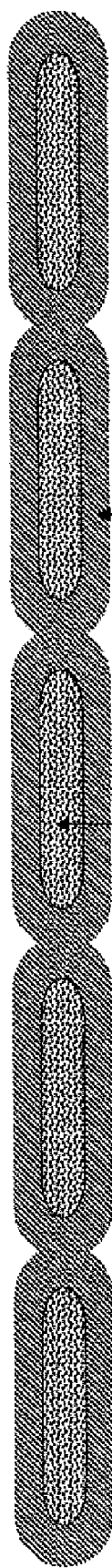
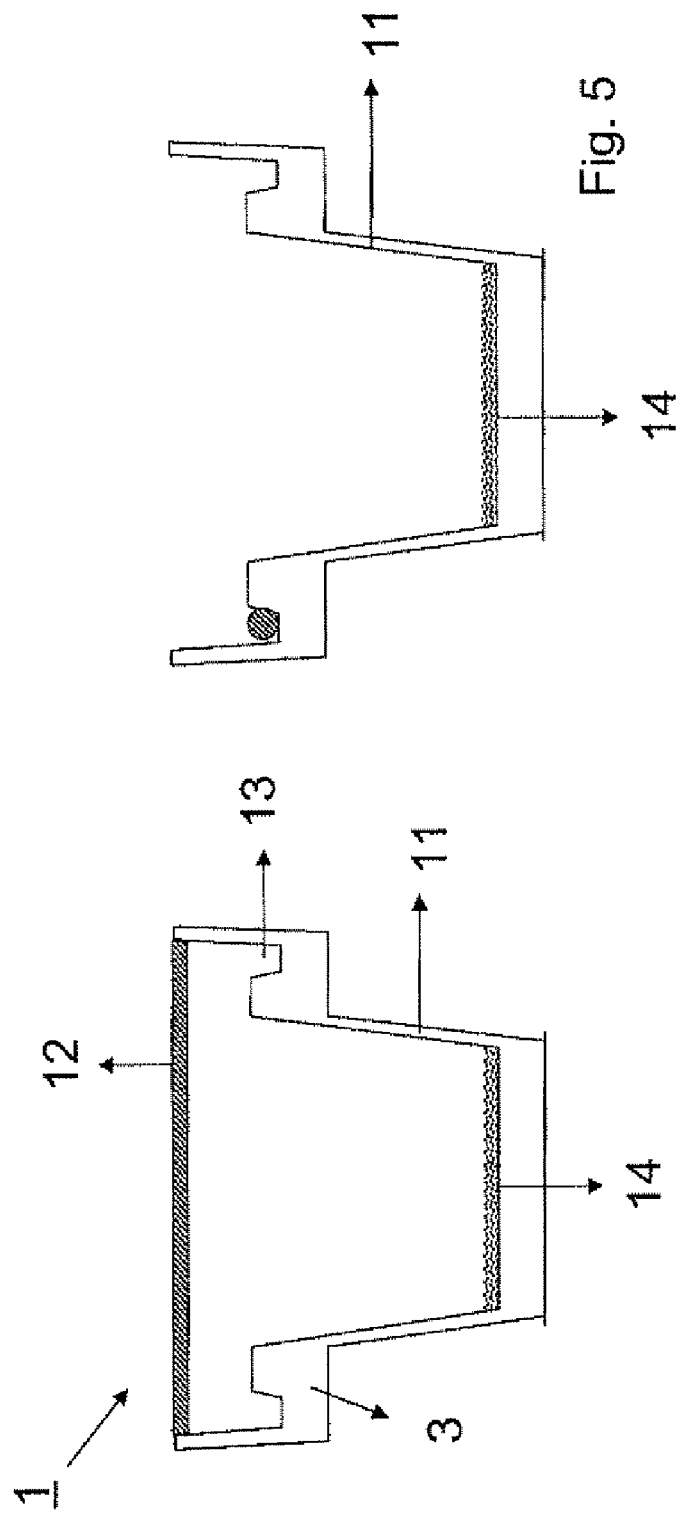

METHOD FOR DEPOSITING A VAPOUR DEPOSITION MATERIAL

CROSS REFERENCE TO RELATED APPLICATION

This application is a continuation of international application No. PCT/EP2006/011775, filed Dec. 7, 2006, which claims priority to European Patent Application No. 05026703.8, filed Dec. 7, 2005. The subject matter of PCT/EP2006/011775 and EP 05026703.8 are expressly incorporated herein by reference.

TECHNICAL FIELD

The invention relates to a method for depositing a vapour deposition material on a base material, in particular for doping a semiconductor material. The invention also relates to a vapour deposition batch and to a method for producing the vapour deposition batch.

BACKGROUND OF THE INVENTION

Many new materials being used nowadays in high technology sectors are sensitive to an atmosphere surrounding the material, i.e. to air and moisture for example. One example is materials which are used for organic electronic components, such as organic light-emitting diodes (OLEDs) for example.

Since the demonstration of low operating voltages by Tang et al. (cf. C. W. Tang et al., Appl. Phys. Lett. 51 (12), 913 (1987)), OLEDs have been promising candidates for producing new lighting and display elements. They comprise a sequence of thin layers of organic materials, which are preferably applied in vacuo by vapour deposition or in their polymeric form by spin-on deposition. After electrical contacting by means of metal layers, they form a wide range of electronic or optoelectronic components, such as diodes, light-emitting diodes or photodiodes for example. The thin organic layers can also be used to produce transistors. These organic components compete with the established components based on inorganic layers.

In the case of organic light-emitting diodes, light is generated by the injection of charge carriers (namely electrons from one side and holes from the other side) from the contacts into adjoining organic layers as a result of an externally applied voltage, the subsequent formation of excitons (electron/hole pairs) in an active zone and the recombination of these excitons to produce light, and said light is emitted from the light-emitting diode.

The advantage of such organic-based components over conventional inorganic-based components, for example semiconductors such as silicon or gallium arsenide, lies in the fact that it is possible to produce elements with a very large surface area, that is to say large display elements such as screens or display panels. The organic starting materials are relatively inexpensive compared to inorganic materials. Moreover, due to their lower processing temperature compared to inorganic materials, these materials can be applied to flexible substrates, which opens up a large number of new applications in the field of display and lighting technology.

Document U.S. Pat. No. 5,093,698 describes an organic light-emitting diode of the pin type, which is an organic light-emitting diode with doped charge carrier transport layers. In particular, use is made of three organic layers which are located between two contacts formed as electrodes. In said document, n-doped and p-doped layers improve the injection of charge carriers and the transport of both holes and electrons into the correspondingly doped layer. The energy levels HOMO ("Highest Occupied Molecular Orbital") and LUMO ("Lowest Unoccupied Molecular Orbital") are preferably selected such that both types of charge carrier are "trapped" in the emission zone so as to ensure efficient recombination of electrons and holes. The restriction of the charge carriers to the emission zone is achieved by suitably selecting the ionization potentials/electron affinities for the emission layer and/or the charge carrier transport layer. The emission layer can also be doped with fluorescent or phosphorescent emitter dopants.

The component structure known from document U.S. Pat. No. 5,093,698 leads to greatly improved charge carrier injection from the contacts into the organic layers. The high conductivity of the doped layers moreover reduces the voltage drop which occurs there during operation of the OLED. For a desired light density, doped components may therefore require much lower operating voltages than comparable undoped structures.

Particularly the dopants for the electron transport layer are very sensitive to oxygen and moisture. Since these molecules are very strong donors in the case of n-doping, they react at least partially with the surrounding air even at room temperature, and thereafter cannot perform, or at least cannot fully perform, their function in the OLED. This applies both to inorganic n-dopants such as caesium and to organic n-dopants such as decamethylcobaltocene.

It is known that emitter dopants, too, react with the oxygen in the air and with moisture at room temperature, as a result of which the efficiency of the OLED is reduced and possibly the spectrum of light emission is shifted. One example of such a reactive material is the phosphorescent emitter tris(1-phenylisoquinoline) iridium (III). However, other materials used in organic components may also react with the surrounding atmosphere at room temperature.

This means that such materials have to be protected from ambient air during the production of the organic components and also once the latter have been finished. Since such components are encapsulated after they have been produced, for example by means of a so-called thin layer encapsulation or by adhesive bonding to a glass or metal cap, the production of the component is particularly critical. During this production, the air-sensitive material is thermally evaporated in a vacuum installation and deposited on a substrate of the component. This method step is not critical for the air-sensitive material, since it usually takes place in vacuo and the air-sensitive material is therefore unable to react with ambient air. By contrast, the transport of the air-sensitive material to the vacuum coating chamber and the charging of the latter with the air-sensitive material are critical. Charging via an inert gas glove box is usually not possible, and therefore charging via ambient air is necessary.

The charging of a conventional coating installation with a vapour deposition material, which in particular is sensitive to air, for coating by means of evaporation should as far as possible take place without the vapour deposition material that is to be processed being exposed to the ambient air and without requiring modification of the coating installation. For this purpose, the vacuum chamber is usually connected to a glove box which is filled with inert gas, such as nitrogen or argon for example. The sensitive vapour deposition material is then charged into the chamber via the glove box. This procedure is not very practical since most coating installations are not connected to a glove box and the provision and maintenance of such a glove box are very costly and complicated.

As an alternative, attempts have been made firstly to fill the vapour deposition material into containers which are flooded with an inert gas, and then to bring the material into the vacuum chamber as quickly as possible and rapidly evacuate the latter. With this procedure, contact with the ambient air is admittedly reduced, but this charging procedure is not sufficient for many of the highly reactive vapour deposition materials. Even the brief contact of the sensitive material with the ambient air is sufficient for the material to at least partially react with the oxygen or water.

Another alternative consists in using a source for the vapour deposition material which can be separated from the evaporation installation, wherein the source has to be sealed in a gas-tight manner after it has been removed. The source can then be filled with the air-sensitive vapour deposition material in a glove box under inert gas, sealed in an air-tight manner, transferred out of the glove box and re-connected to the coating installation. As soon as there is no longer any oxygen or water in the vacuum installation, the separation between source and coating installation is lifted, and the vapour deposition process can begin without it being possible for the air-sensitive material to react. One disadvantage of this variant is that such sources are not very widespread. They are expensive and the charging procedure is complicated.

A method to deposit a vapour deposition material is known (see patent abstract of JP 59031865), wherein a vapour deposition batch of a vapour deposition material is placed in a housing, which is then closed with a lid. The lid is made of a material, which can be broken up by means of heating or internal pressure. By way of an example a thin film made of quartz can be used. Laser light is irradiated on the vapour deposition batch to evaporate the vapour deposition batch of the vapour deposition material during deposition.

SUMMARY OF THE INVENTION

The object of the invention is to provide a method for depositing a vapour deposition material on a base material, in particular for doping a semiconductor, in which the handling of the vapour deposition material is facilitated. Moreover, a vapour deposition batch with improved ease of handling and a method for producing the vapour deposition batch are also to be provided.

According to the invention, this object is achieved by a method for depositing a vapour deposition material on a base material according to independent Claim 1, a vapour deposition batch according to independent Claim 5 and a method for producing a vapour deposition batch according to independent Claim 10.

The vapour deposition material is reactive, in particular it is sensitive to air. It is sensitive to one or more of the gases and/or gas mixtures contained in air. As an alternative or in addition, it may be sensitive to moisture.

Compared to the prior art, the invention has the advantage that the vapour deposition material is easier to handle, and correct handling of the vapour deposition material prior to evaporation is ensured by shielding the vapour deposition material from the surrounding environment. In this way, the quality of the vapour deposition material is maintained, and transport and storage thereof are facilitated. Within the context of the invention, an air-tight enclosure exists even if slight permeation of water vapour through the shell is possible.

As a result, on the one hand a reliable, air-tight enclosure of the vapour deposition material is ensured, and on the other hand easy opening of the shell for the purpose of evaporating the vapour deposition material is possible. This ensures a clear separation of the process steps for opening the shell and subsequently evaporating the vapour deposition material.

By way of example, an alloy or a metal is used as the meltable shell material. Such materials with a low melting temperature are known as such in various embodiments, so that an expedient choice can be made for specific use purposes. In principle, the shell for enclosing the vapour deposition material may be formed entirely or only partially from the meltable shell material.

It may be provided that the shell has a section made from a bimetal or a spring steel, which serves as a type of lid or opening which can be opened/closed. Similarly, an alternative embodiment of the invention may provide for the use of a material, in particular a metal or an alloy, with shape memory. In this case, a "thermal memory effect" is used to open/close the shell.

In one further development of the invention, it may be provided that the shell is opened in the region of a shell section which is formed as a film. Films can be processed using a wide range of processing methods and are used in various applications for the air-tight packaging or encapsulation of materials. Moreover, the use of a film allows easy opening of the shell for the purpose of evaporating the vapour deposition material.

In order to avoid undesirable reactions of the vapour deposition material with other chemical substances or compounds prior to the deposition, it is provided in one advantageous embodiment of the invention that a vacuum environment or an inert gas atmosphere is maintained in the vapour deposition chamber during the evaporation and deposition of the vapour deposition material.

For dependent claims relating to a vapour deposition batch and to a method for producing the vapour deposition batch, the advantages discussed in connection with dependent claims of the method for depositing a vapour deposition material having the associated features apply accordingly.

For the vapour deposition batch, in one advantageous embodiment of the invention, the shell is closed by means of adhesive bonding, cold forming, welding or soldering. The processes of cold forming also include in particular squeezing to close the shell.

One advantageous further development of the invention may provide that, in the vapour deposition batch, the shell is at least partially formed by a crucible, from which the vapour deposition material can be evaporated for deposition. As a result, a crucible which is adapted to the vapour deposition material can be used during deposition without requiring any adaptation of the coating installation, since the crucible can be introduced into the coating installation together with the vapour deposition material.

In one embodiment of the invention, it is provided that a receiving device, for receiving at least one shell section which is broken up when the shell is opened, is formed on the crucible. In this way, it is possible that, when the crucible is removed from the coating installation after the deposition, the remains of the broken shell can be removed at the same time. By way of example, it may be provided that the receiving device receives a shell section which contracts as the shell is melted.

In connection with producing the vapour deposition batch, in which the vapour deposition material is surrounded in an air-tight manner by the shell, one further development of the invention provides that a space which holds the batch quantity is evacuated and/or filled with an inert gas when the batch quantity of the vapour deposition material is enclosed, so that it can reliably be ensured that no air remains in the space enclosed by the shell.

BRIEF DESCRIPTION OF THE DRAWINGS

The invention will be explained in more detail below on the basis of examples of embodiments and with reference to the figures of a drawing, in which:

FIG. 1 shows a schematic diagram of a vapour deposition batch in cross section, in which a batch quantity of the vapour deposition material is enclosed in an air-tight manner by a shell;

FIG. 2 shows a schematic diagram of a vapour deposition batch, in which a batch quantity of the vapour deposition material is arranged in a crucible which is sealed in an air-tight manner;

FIG. 3 shows a schematic diagram of a vapour deposition batch, in which a batch quantity of the vapour deposition material is enclosed in an air-tight manner in a box-shaped crucible;

FIG. 4 shows a schematic diagram of an arrangement of a plurality of cohesively formed vapour deposition batches, in which a single shell is formed for a plurality of batch quantities;

FIG. 5 shows a schematic diagram of the vapour deposition batch of FIG. 2, in cross section, in the closed state and in the open state;

DETAILED DESCRIPTION

Figure 6:
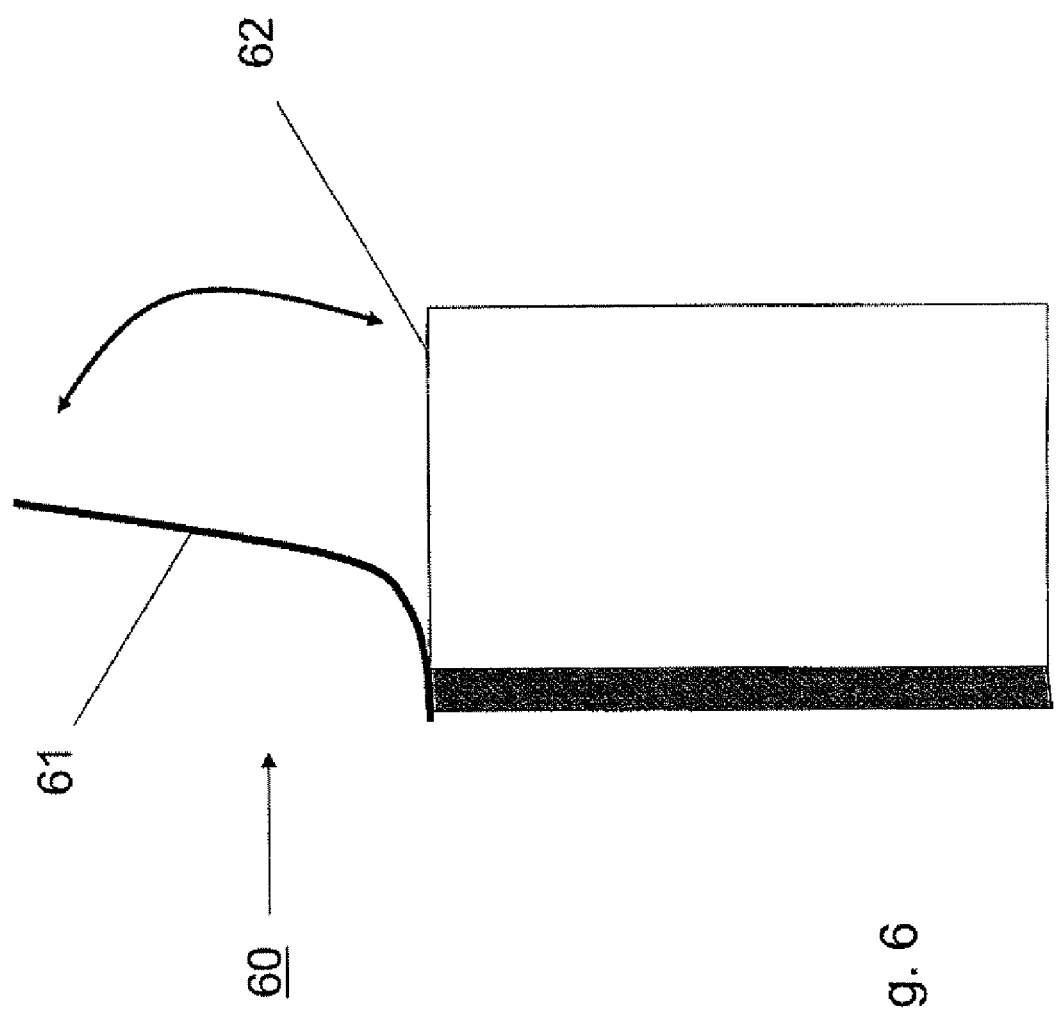
FIG. 6 shows a schematic diagram of a vapour deposition batch in cross section, in which a shell for holding a batch quantity of the vapour deposition material is provided with a lid.

After being produced and before being used for deposition by means of a coating or vapour deposition installation, a sensitive material for vapour deposition, which will hereinafter also be referred to as the vapour deposition material, is enclosed in an air-tight manner in a shell, as a result of which a vapour deposition batch is formed which contains a batch quantity of the material to be vapour-deposited, enclosed in an air-tight manner in a shell which can also be referred to as the encapsulation. Within the context of the invention, an air-tight enclosure exists in particular even if slight permeation of water vapour through the shell is possible. Preferably, the permeation of water vapour is limited to at most around 100 to 1000 g per $m^2$ and per day.

FIG. 1 shows a schematic diagram of a vapour deposition batch 1 in cross section, in which a batch quantity 2 of the vapour deposition material is enclosed in an air-tight manner in a shell 3. The production of the vapour deposition batch 1 is carried out for example in a glove box under an inert gas atmosphere or in vacuo, for example by shrink-wrapping it in an inert shell material which melts at a temperature lower than an evaporation temperature of the material that is to be vapour-deposited.

During deposition of the vapour deposition material, the vapour deposition batch 1 thus formed is then placed in a vapour deposition crucible in a coating or vapour deposition chamber of a deposition or coating installation (not shown). The coating chamber is then evacuated. When producing the vapour deposition batch 1, care should be taken to ensure that as little inert gas as possible is included in the encapsulation, since otherwise a force which could destroy the shell 3 acts on the shell material during the evacuation due to the overpressure in the interior of the vapour deposition batch 1 which is surrounded by the shell 3 in the form of an encapsulation. If only small quantities of inert gas are contained within the shell 3, any breaking-open of the encapsulation during the evacuation is avoided.

In the example of embodiment for depositing the vapour deposition material, the vapour deposition crucible is then heated in a further step in order to evaporate the vapour deposition material. Here, the shell material melts at the melting temperature which is lower than an evaporation temperature of the vapour deposition material, and thus releases the vapour deposition material. The vapour deposition material thus released does not chemically react since it is already under vacuum, but rather will evaporate when its evaporation temperature is reached and then will be deposited on a substrate to be coated. A semiconductor substrate can for example be doped in this way.

As materials for the shell for enclosing the vapour deposition material in an air-tight manner, use may be made in the various embodiments of the invention of materials which have one or more of the following properties:

low vapour pressure in the solid phase,
low vapour pressure in the liquid phase,
no chemical reaction with the vapour deposition material, even at high temperatures,
a melting temperature of the material used for encapsulation is lower than an evaporation temperature of the vapour deposition material,
low wetting of the vapour deposition crucible and of the vapour deposition material,
mechanical properties of the material for the shell, in particular a material which is not too brittle or too fragile, permit the air-tight enclosure of the vapour deposition material,
no permeability or little permeability for or permeation of oxygen, air and water vapour,
inexpensive or reusable material,
environmentally friendly material.

By way of example, use may be made of materials from the following classes of material, metal alloys, for example Indalloy 57 consisting of 50% bismuth, 30% lead and 20% tin with a melting temperature of approx. 100° C.,
metals with a low melting temperature, for example indium with a melting temperature of approx. 156° C.,
low-melting glass solders, for example DM2700 with a melting temperature of approx. 300° C.

Metal alloys with a low melting point represent a class of material which is particularly suitable for the proposed encapsulation, since there are various metal alloys which melt at very low temperatures. In particular, these may be low-melting alloys, that is to say alloy systems of metals with a melting temperature which is considerably lower than the melting temperature of the starting metals. By way of example, a mixture of 49% bismuth, 18% lead, 12% tin and 21% indium melts at a temperature of 58° C. A mixture of 58% bismuth and 42% tin, on the other hand, melts at 138° C. Both mixtures are eutectic, which means that they have a precisely defined melting temperature. Other metal alloys, such as 60% bismuth and 40% tin for example, melt within a certain temperature range, in this case within a range from 138° C. to 170° C. Both classes of metal alloys are suitable for the encapsulation of air-sensitive materials.

The melting of glass solders typically takes place at somewhat higher temperatures, for example at 300° C. or above. Since numerous materials which are used in optoelectronic components are also evaporated within this temperature range, for example CuPc or ZnPc, these classes of material can also be used for the encapsulation of vapour deposition materials.

Of the pure metals which are suitable, mention may be made, in addition to the aforementioned indium, also of gallium (melting temperature 30° C.), tin (232° C.), thallium (304° C.), lead (327° C.) and zinc (419° C.) as shell material.

In the described embodiments and in general, the shell used for encapsulation may be formed from one or more materials, that is to say for example exclusively from one melting material. Regardless of the specific embodiments in which they are presented here, the examples of materials which are given can also be combined with other embodiments.

FIG. 2 shows a schematic diagram of a vapour deposition batch 10 in which a batch quantity of a vapour deposition material is arranged in a crucible 11 which is closed in an air-tight manner by means of a shell section 12 made from a low-melting material, said shell section being formed as a film. In order to produce the vapour deposition batch 10, the batch quantity of the vapour deposition material is filled directly into the crucible 11 inside a glove box (not shown), said crucible then being closed by means of the film, which is made for example from indium, wherein the film is fixed to the crucible 11 for example by means of soldering or adhesive bonding, as is known in principle in a similar manner for sealing a yoghurt pot or the packaging of a medicinal product.

Nowadays, vapour deposition materials are often no longer evaporated from so-called point sources but rather from linear sources. In this case, too, it is possible to use encapsulation or enclosure in the manner proposed above. FIG. 3 shows a schematic diagram of a vapour deposition batch 20, in which a batch quantity of a vapour deposition material is arranged in a linear source designed as a box-shaped crucible 21 wherein the box-shaped crucible 21 is closed in an air-tight manner by means of a shell section 22 designed as a lid. The shell section 22 is made from a low-melting material and is applied for example by means of soldering or adhesive bonding. A vapour deposition batch having a desired length may also be formed as a linear source in which the vapour deposition material is enclosed in an air-tight manner by a shell made from the low-melting material. In this case, just a single material chamber containing the batch quantity of the vapour deposition material may be formed, or else the air-sensitive material may be divided over a number of chambers, as shown schematically in FIG. 4, as a result of which the homogeneity with which the material to be vapour-deposited is distributed in the linear source is improved.

Prior to the encapsulation of the air-sensitive material, the material for the shell and/or the crucible may be heated for a certain period of time, for example 1 h, at a certain temperature which is as high as possible but lower than the melting temperature of the shell material, in order to drive out any water attached thereto.

In order to form the encapsulation or enclosure of the air-sensitive material in a gas-tight manner, it is also possible to use, in addition to the aforementioned methods of adhesive bonding and soldering, also other methods which operate at elevated temperature and make use of the fact that the material softens at elevated temperature. Moreover, it is also possible to use methods which are based on cold forming of the shell material, such as cold rolling, cold welding or riveting for example.

Since some of the low-melting materials which can be used for the shell are not very cost-effective, said materials may optionally be reused. This means that at the end of deposition, the shell materials then remaining in the vapour deposition crucible are removed, optionally purified, for example by smelting, and then reused for further encapsulations. A special design of the crucible may be provided for this.

FIG. 5 shows a schematic diagram of the vapour deposition batch of FIG. 2, in cross section, in the closed state and in the open state. In the closed state, the crucible 11 is closed by the shell section 12 made from low-melting material, said shell section being designed as a lid. When, upon heating in the coating installation, the material of the shell section 12 melts, said material shrinks due to the surface tension and drops into the crucible 11 in the form of little balls. It is collected there by a collecting channel 13 and therefore does not come into contact with a batch quantity 14 of the vapour deposition material. As a result, the situation whereby the material of the shell section 12 and the vapour deposition material would react with one another can be reliably ruled out, even if the shell material is not fully inert. The collecting channel 13 is one possible embodiment of a collecting device for receiving residues of the shell when the latter is broken up during evaporation of the vapour deposition material.

It may also be provided that the shell for the air-sensitive material recloses by itself as it cools. As shown in FIG. 6, a shell 60, in which the air-sensitive material is accommodated, has a lid 61 made from a bimetal. Due to the effect of heat, either during heating of the lid 61 itself or of the shell 60, during the heating phase in preparation for the vapour deposition, a shear stress occurs due to the different thermal expansion coefficients. This shear stress deforms the bimetal in such a way that the material to be evaporated can then exit from an opening 62. Optionally, it is also possible for just part of the lid 61 to be made from bimetal, for example a joining layer thereof which undergoes the thermal deformation and thus raises the lid 61 and opens the shell. Layers of the bimetal element are arranged in such a way that the bending process leads to opening. As it is cooled, the bimetal element returns to its original shape and closes the opening. This procedure can be configured in a reversible manner by using the effect of heat.

A similar in situ mechanism which is not reversible but can be repeated can also be achieved by means of "memory alloys" (for example the nickel/titanium alloy "nitinol"). In this case, the closure part of the shell or parts thereof (cf. FIG. 6) are made from a memory alloy. Use is made of the "thermal memory effect", which is based on sudden rearrangement of the metal grid of the alloy at a given temperature (approx. 50° C. in the case of nitinol). At a temperature above the metal grid rearrangement point, the lid or parts thereof are configured in such a way that the shell, in which the material to be evaporated is to be accommodated, is opened. During the subsequent cooling phase, the metal grid undergoes a reorientation, but the outer shape of the component remains the same. The air-sensitive material can then be introduced under a protective gas atmosphere, and the opening is closed by bending the closure part which is made from a memory alloy. During the phase of heating the evaporation source, a change in shape is triggered when the critical temperature for metal grid rearrangement is exceeded, which leads to the closure part returning to its original shape prior to bending, that is to say that the shell is opened again and the evaporation of the air-sensitive material can take place in vacuo.

After filling, the shell can be evacuated so that the lid, which is made for example from spring steel or from a bimetal or from a memory alloy, is particularly well sealed due to the external overpressure. During the evacuation of the vacuum evaporation chamber, the pressure difference continually decreases so that either the elastically deformable lid opens immediately or, as described above, the subsequent heating during the heating phase leads to deformation/opening.

Figure 7:
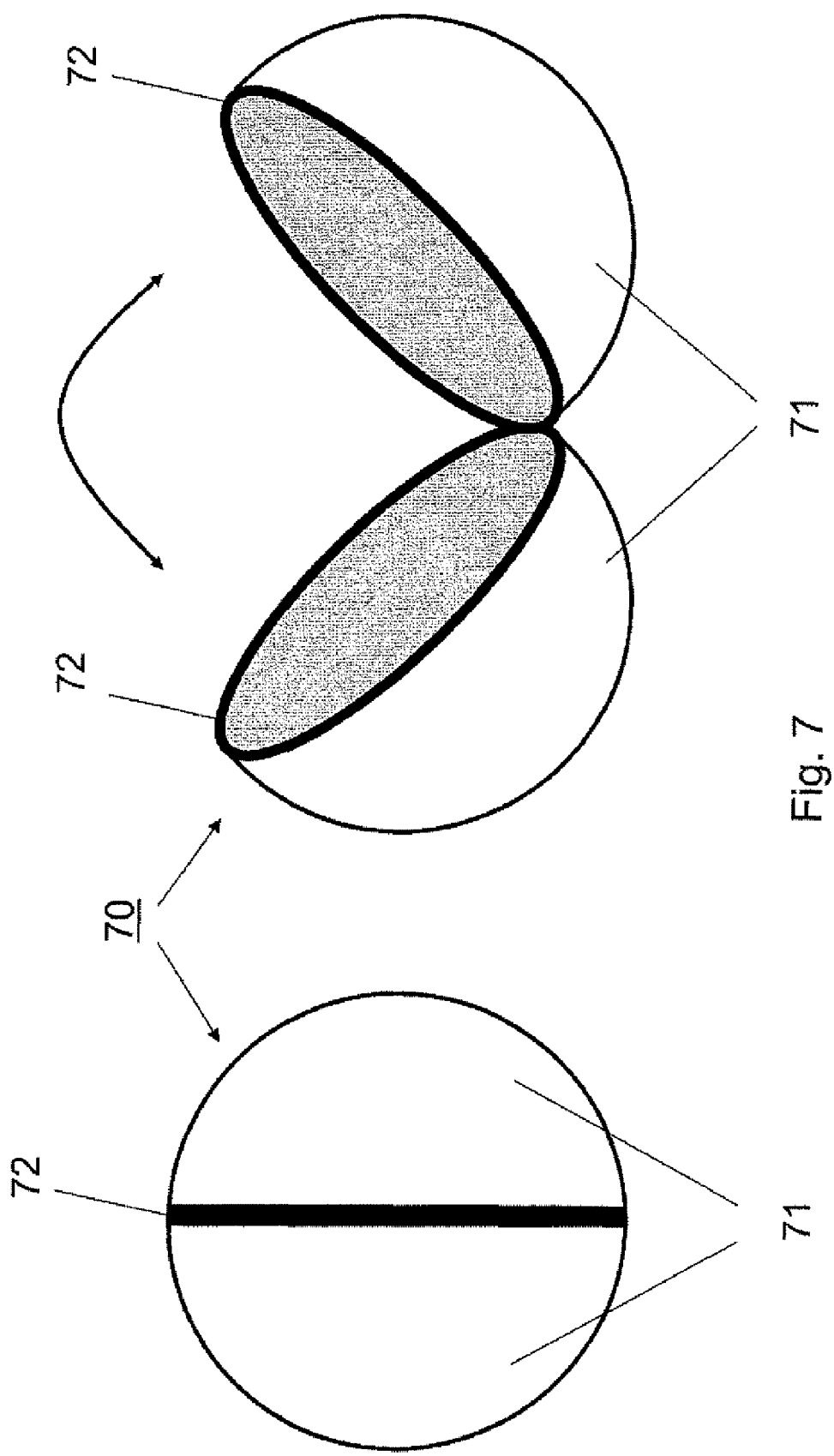
FIG. 7 shows a schematic diagram of a vapour deposition batch in cross section, in which a shell is formed from two semi-spherical shells.

FIG. 7 shows a further example of embodiment. Two hollow bodies which are open at one side, in this case two semi-spherical shells 71, made from an air-tight material into which the air-sensitive material has been filled under a protective gas atmosphere, are then joined to one another in an air-tight manner at the circular edges by means of an alloy 72. By applying heat, a joining seam made from the alloy 72 melts below the evaporation temperature of the air-sensitive material, so that the semi-spherical shells 71 come apart from one another and the material located therein sublimates when the evaporation temperature is reached and can be deposited on a substrate. Sealing against air and moisture can also be ensured solely by joining the two semi-spherical shells 71 and then evacuating the cavity. As already mentioned above, this arrangement then opens automatically during the evacuation of the vacuum evaporation chamber, as soon as the pressure inside the evaporation chamber drops below the pressure prevailing inside the spherical shells.

The invention will be explained in more detail below on the basis of further examples of embodiments, in particular in relation to the features discussed with reference to FIGS. 1 to 5.

In one embodiment for producing a vapour deposition batch, use is made of two film-like sheets of Indalloy 57 having the composition Bi 50%, Pb 30%, Sn 20% and a melting point of approx. 100° C. Half a gram of tris(1-phenylisoquinoline) iridium (III) is arranged between the two sheets of the film, and the edges of the film are soldered, for example using a conventional soldering bit.

The sealed "package" was placed in a ceramic vapour deposition crucible in a vapour deposition chamber of a vacuum vapour deposition installation (not shown). The vapour deposition chamber was evacuated to a pressure of $10^{-6}$ mbar. The ceramic vapour deposition crucible was then heated. At a temperature of 280° C., a vapour deposition rate for the tris(1-phenyliso-quinoline) iridium (III) was measured, which corresponds to that in a reference situation in which the tris(1-phenylisoquinoline) iridium (III) was filled into the crucible in the conventional manner using a glove box and without encapsulation. By means of this deposition process, an organic light-emitting diode was produced using the encapsulated emitter material, which at a voltage of 2.9 V exhibited a light emission of 100 cd/m2 with CIE colour coordinates of (0.68; 0.32). These values correspond very well with reference values for organic light-emitting diodes produced using the emitter material tris(1-phenylisoquinoline) iridium (III) when the emitter material was not used with an air-tight shell but rather in the conventional manner.

After producing the organic light-emitting diode, the ceramic vapour deposition crucible of tris(1-phenylisoquinoline) iridium (III) was examined. It was found that the Indalloy 57 remained as a clump in the crucible, whereas the remaining tris(1-phenyliso-quinoline) iridium (III) powder was present in the crucible in separated form. This also shows that reuse of the shell material is possible without any problems.

Figure 8:
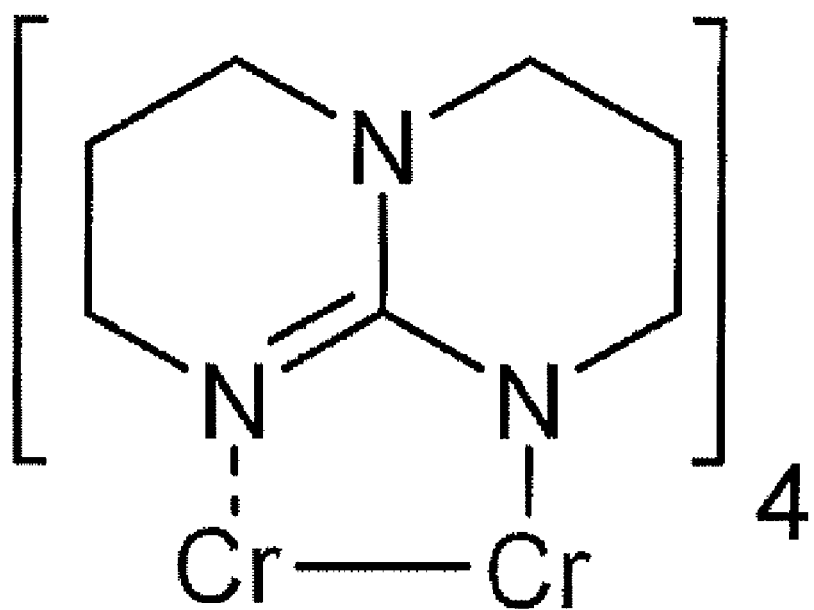
FIG. 8 shows the chemical structural formula of $Cr(hpp)_4$.

In another example of embodiment, an indium film was heated for one hour at 120° C. in a glove box in order to reliably remove any moisture which may have deposited on the surface. The film was then folded to produce an envelope into which the air-sensitive dopant $Cr(hpp)_4$ (cf. FIG. 8) was filled. The edges were cold-welded to make them air-tight, by using a pair of tongs to exert pressure on the edges. Two of these envelopes were prepared. The first was placed in a glass cylinder which was then evacuated. The envelope inflated, indicating that the encapsulation was air-tight. The envelope was not destroyed. The cylinder was then heated, whereupon the indium melted and the encapsulated material was released, without being blown away due to the pressure drop in the envelope.

The second envelope was used to produce a doped charge carrier transport layer for an organic light-emitting diode. ZnPc was used as the matrix for the charge carrier transport layer. The measured conductivity of the doped charge carrier transport layer was in the region of the conductivity of reference samples produced using a dopant which was charged into the vapour deposition chamber in the conventional manner using a glove box and without encapsulation.

The two examples of embodiments just described show that low-melting materials, for example metals or metal alloys, are particularly suitable for hermetically sealing, from the ambient air, air-sensitive materials which are to be processed in a thermal vacuum vapour deposition or coating installation. Materials encapsulated in this way can then be evaporated in the conventional manner without any loss in terms of performance.

It should be apparent that the foregoing relates only to certain embodiments of the present application and that numerous changes and modifications may be made herein by one of ordinary skill in the art without departing from the general spirit and scope of the invention as defined by the following claims and the equivalents thereof.

We claim:

1. Method for depositing a vapour deposition material on a base material, comprising the following steps:
    introducing a vapour deposition batch into a vapour deposition chamber, wherein the vapour deposition material is enclosed in an air-tight manner by a shell, wherein at least a portion of the shell comprises a meltable shell material that is meltable at a temperature lower than the evaporation temperature of the vapour deposition material; and
    opening the shell in the vapour deposition chamber so that the vapour deposition material in the vapour deposition chamber evaporates and deposits on the base material, wherein the shell is opened by at least partially melting, by heating, the meltable shell material.

2. The method according to claim 1, wherein the meltable shell material comprises an alloy or a metal.

3. The method according to claim 1, wherein the shell is opened in a region of a shell section comprising a film.

4. The method according to claim 1, wherein a vacuum environment or an inert gas atmosphere is maintained in the vapour deposition chamber during the evaporation and deposition of the vapour deposition material.

5. Method for producing a vapour deposition batch comprising a vapour deposition material for depositing on a base material, comprising the following steps:
    providing a batch quantity of the vapour deposition material;
    enclosing the batch quantity of the vapour deposition material in an air-tight manner by a shell, wherein the shell is at least partially formed by heating a meltable shell material, wherein the meltable shell material has a melting temperature which is lower than the evaporation temperature of the vapour deposition material.

6. The method according to claim 5, wherein the meltable shell material comprises an alloy or a metal.

7. The method according to claim 5, wherein the shell is closed by adhesive bonding, cold forming, welding, or soldering.

8. The method according to claim 5, wherein the shell is at least partially formed by a crucible from which the vapour deposition material can be evaporated.

9. The method according to claim 8, wherein the crucible comprises a receiving device, wherein the receiving device receives at least one shell section which is broken when the shell is opened.

10. The method according to claim 5, wherein a space which holds the batch quantity is evacuated or filled with an inert gas when the batch quantity of the vapour deposition material is enclosed.

* * * * *